United States Patent [19]
Owen et al.

[11] Patent Number: 5,675,888
[45] Date of Patent: Oct. 14, 1997

[54] MOLDED PRINTED CIRCUIT BOARD WITH WIPE-IN CONNECTOR AND METHOD OF MAKING SAME

[76] Inventors: Marvin Leroy Owen, 12950 Via Catherina; Mark James Miller, 5051 Middleboro, both of Grand Blanc, Mich. 48439

[21] Appl. No.: 279,643

[22] Filed: Jul. 25, 1994

[51] Int. Cl.⁶ .................................................. H05K 3/00
[52] U.S. Cl. ........................... 29/829; 29/848; 439/55; 439/77
[58] Field of Search ................... 439/77, 55; 29/829, 29/846, 848, 858, 883, 885; 434/404, 931

[56] References Cited

U.S. PATENT DOCUMENTS 4,798,544  1/1989  Hartman .................... 439/404
5,397,239  3/1995  Zaderej et al. ............... 439/55

*Primary Examiner*—Neil Abrams
*Assistant Examiner*—Barry Matthew L. Standig

[57] ABSTRACT

An automotive instrument cluster case is molded of a resin material. A rigid rear wall of the case has a planar outer surface including a connector region having two adjacent flaps, each flap molded with a thin flexible section and a rigid terminal section. Printed circuit paths are applied to the plane outer surface including the flaps. Then the flaps are deformed into the case, with the flexible section being curved and the terminal sections being spaced apart with the circuit paths forming terminal strips facing one another to form a connector socket. Interlocking stop elements molded on the inner surface hold the flaps apart to receive a male connector.

5 Claims, 3 Drawing Sheets

MOLDED PRINTED CIRCUIT BOARD WITH WIPE-IN CONNECTOR AND METHOD OF MAKING SAME

FIELD OF THE INVENTION

This invention relates to circuit board connectors and particularly to wipe-in connectors in a molded circuit board having conductors formed in a single plane and a method of making the connectors.

BACKGROUND OF THE INVENTION

The automotive industry uses a large number of printed circuit boards which must be reliable and because of the high volumes must also be low cost. One usage of such circuit boards is in instrument clusters which contain gauges or other instruments, a connector for coupling to a vehicle wiring harness, and circuit paths for interconnecting the instrument terminals and the connector.

One such instrument cluster arrangement is a hardboard printed circuit which carries circuit pathways on a single plane and requires a header connector for coupling to the vehicle harness. This arrangement is economically feasible only if there is sufficient electronic circuitry on the board to justify its use. Simpler instrument cluster designs generally use a molded instrument case and a separate flexible mylar printed circuit attached to the back of the case for attachment to the instruments. A recess or pocket is molded in the case and terminal flaps on the circuit fold down into the pocket to receive a male harness connector which has spring terminals which wipe against conductor strips on the flaps and press the flaps against the sides of the pocket. The flexible circuit is inexpensive and a separate connector is avoided. However, a drawback to this usage of flexible circuits is that they must be positioned over a series of pins molded into the case to align them and hold them flat to the case for assembly of lamp sockets and gauge terminal hardware. Despite careful assembly techniques, terminals sometimes tear the circuit or get positioned under it, causing the part to be rejected.

SUMMARY OF THE INVENTION

It is therefore an object of the invention to eliminate the drawbacks of flexible circuitry while retaining the advantage of no separate connector. Another object is to use an inexpensive molded case for an instrument cluster without flexible printed circuits. Still another object is to use such a molded case without either flexible circuits or a separate connector.

The invention is carried out by molding a plastic instrument cluster case having a plane outer surface, forming a printed circuit on the surface, and deforming a portion of the case and its corresponding circuitry into a connector socket. The case is molded of an inexpensive resin such as polypropylene which is also flexible when the section is thin. The molded polypropylene case with copper circuit paths applied by plating, and having satisfactory adhesion to the case may be purchased from Circuit-Wise, Inc., North Haven, Conn.. Two flaps which are to be formed into the connector pocket are molded with a thin section where they join the main part of the case so that when pushed back into the case they curve away from the plane case surface, and the free ends of the two flaps, which are thicker, remain flat and are then disposed in spaced planes transverse to the plane of the case, and the circuitry on each flap is on the side facing the other flap. This circuitry comprises parallel conductive traces extending into the pocket to form terminal strips on the flat terminal portions of the flaps. Thus these spaced flaps comprise a socket to receive a harness connector which wipes along the terminal strips when inserted.

When the flaps are pushed into the case they are held in that deformed condition in readiness to receive the male connector. The inner side of the case is molded with a hook arm on each side of each flap near its free end, and first ribs extending along the case where each flap begins to curve have slots for receiving the hooks to hold the flaps in the deformed position, so that they do not spring back toward their original position. The flaps are supported by abutments molded on the inner side so that they do not flex too far; when the male connector is inserted the flaps must stay firmly in their prescribed position. A stop is molded on the inner side of each free end and comprises a second rib extending from one hook arm to the other; when the hooks engage the slots in the first ribs the second ribs will abut the first ribs to stop further movement of the flaps.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
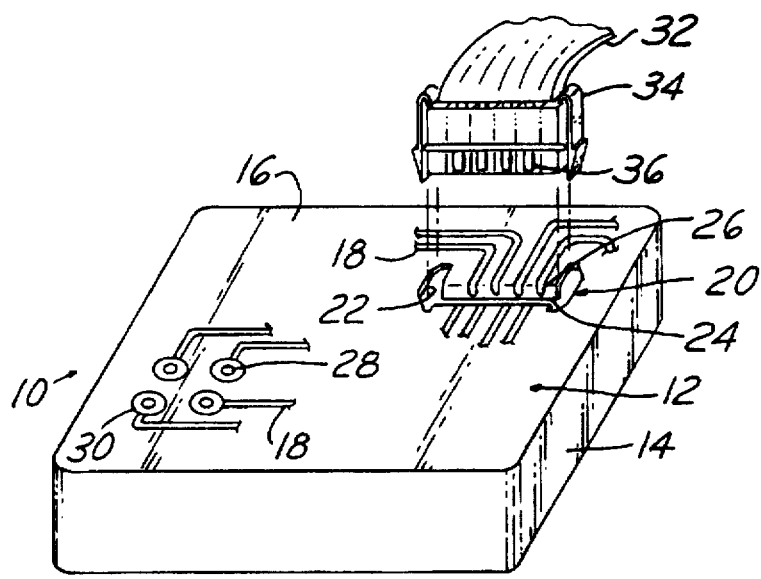
FIG. 1 is an isometric view of a molded instrument cluster case with integral connector socket according to the invention, along with a male harness connector.

Referring to FIG. 1, a molded instrument cluster case 10 has a rear wall 12 and side walls 14. The rear wall 12 has a planar outer surface 16 supporting printed circuit traces 18. A connector socket 20 formed in the rear wall 12 comprises a openings 22, a pair of panels or flaps 24 bent inwardly into the case, and circuit traces 18 on the flaps in parallel arrays forming terminal strips 26. A plurality of small holes 28 in the rear wall are provided to receive terminals of gauges mounted on the inner side of the wall 12. Traces 18 terminate at pads 30 surrounding the holes 28. A vehicle harness 32 terminates in a male connector 34 having an array of copper-beryllium contacts 36 along each side for contacting the terminal strips when the connector 34 is plugged into the socket 20.

Figure 2:
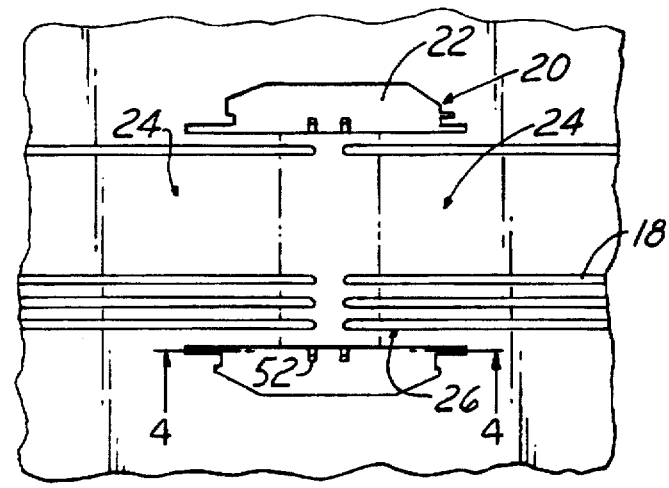
FIG. 2 is a top view of the connector portion of the case of FIG. 1 prior to deforming socket flaps.
Figure 3:
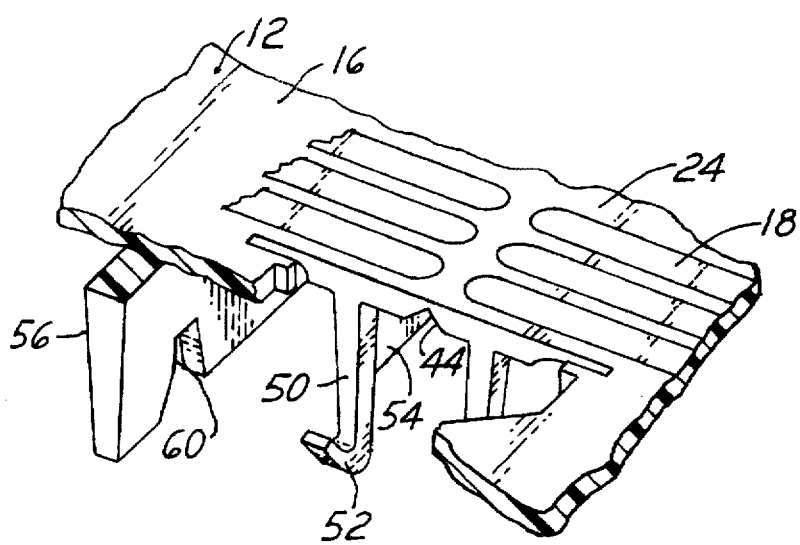
FIG. 3 is a partly broken-away isometric view of the connector of FIG. 2.
Figure 4:
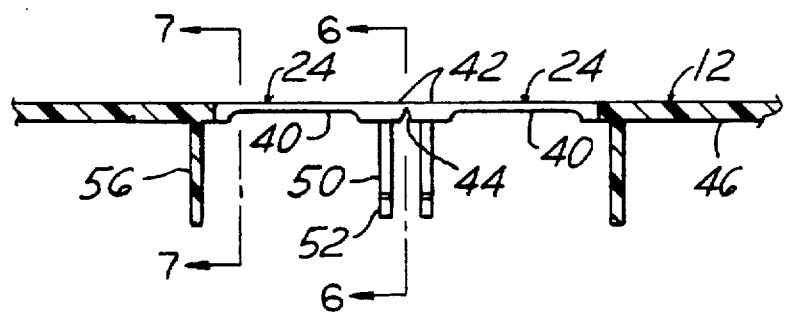
FIG. 4 is a cross section of the connector portion of the case taken along line 4—4 of FIG. 2.
Figure 5:
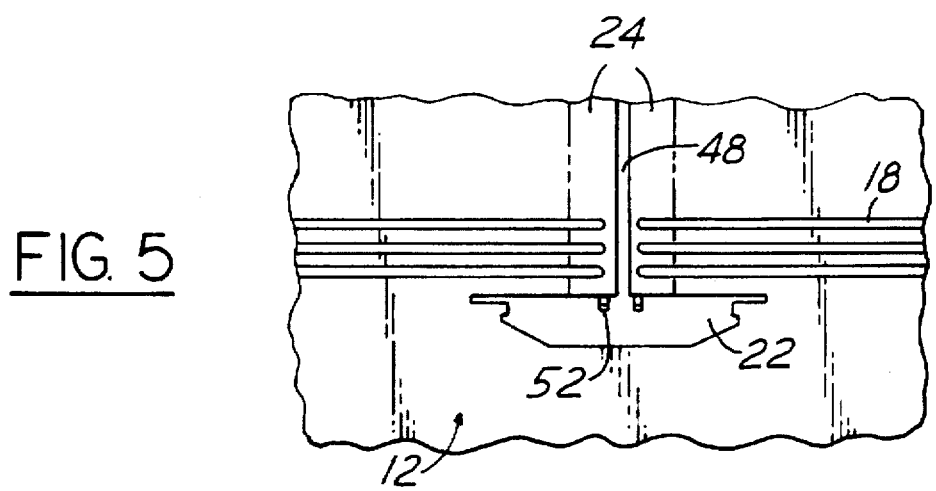
FIG. 5 is a top view of another embodiment of the connector portion of the case prior to deforming socket flaps.

The case 10 is molded of an inexpensive resin such as polypropylene which is flexible when formed in thin sections. As shown in FIGS. 2, 3 and 4, the case is molded with the flaps 24 in the plane of the outer surface 16 and the openings 22 on either side of the flaps. Then, with the flaps 24 still in the plane of the outer surface 16, printed circuits pathways are deposited or formed on the outer surface 16 including the flaps 24. Because of the expense of forming circuits on non-planar surfaces, it is important that this step is performed prior to deforming the flaps. Thus the flaps 24 are pushed into the case after circuit fabrication. The openings 22 are shaped to accommodate locking tangs of the male connector 34 and to allow the flaps to bend out of their original plane. Each flap 24 has a thin flexible web section 40 adjoining the wall 12. The wall surrounding the socket is thicker than the web 40 and is rigid. The inner end 42 of each flap 24 is also thicker than the web 40 so that only the web is curved as the flaps are bent inwardly, the ends remaining as flat terminal portions. To assure that the flaps 24 remain in the original plane during circuit fabrication, they are joined at their inner ends 42. A parting line is defined by a groove 44 in the inner surface 46 of the wall 12. Alternatively, to avoid having to break apart the flaps when they are deformed, they may be formed separated by a slit 48 as shown in FIG. 5 if they are stiff enough for processing prior to deforming. Another approach is a compromise where some portions along the parting line are slits and other portions are interconnected.

Figure 6:
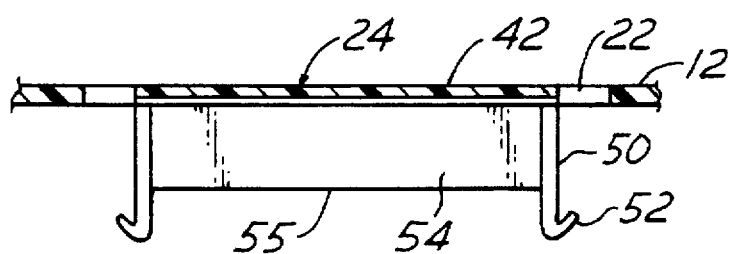
FIGS. 6 and 7 are cross sections taken along lines 6—6 and 7—7 of FIG. 4, respectively.
Figure 7:
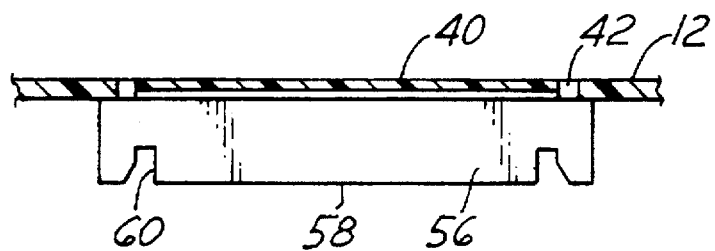
Figure 8:
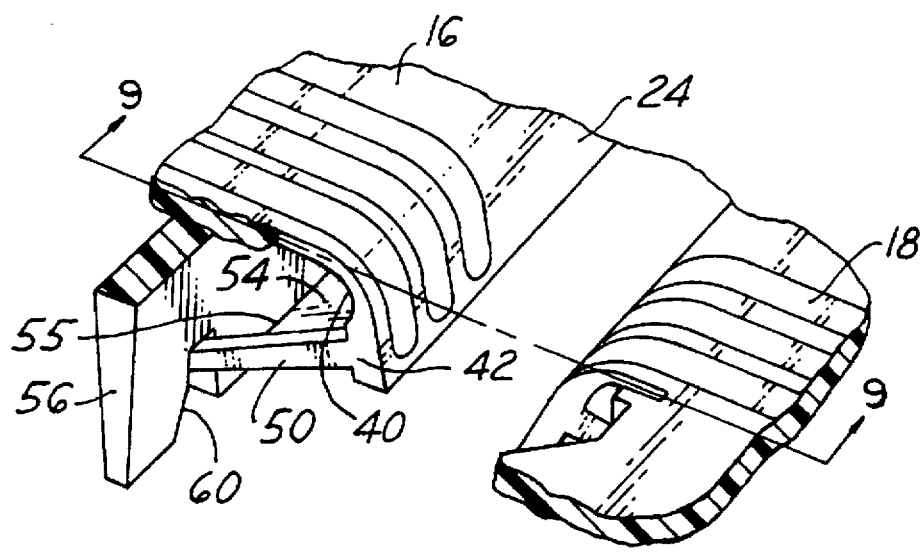
FIG. 8 is a partly broken-away isometric view of the connector according to the invention in its completed configuration.
Figure 9:
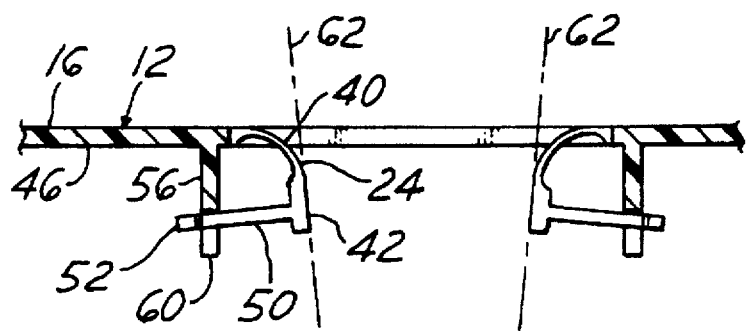
FIG. 9 is a cross section through a connector in its completed configuration taken along line 9—9 of FIG. 8.
Figure 10:
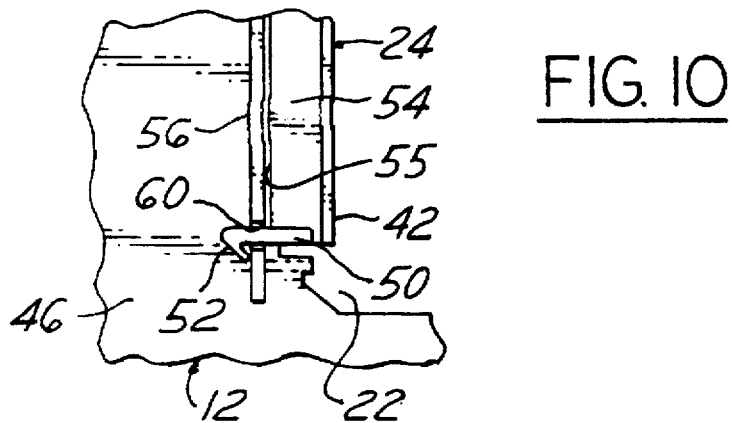
FIG. 10 is a bottom view of a completed connector of FIG. 9, according to the invention.

Stabilizing features are molded onto the inner surface 46 of the case as shown in FIGS. 3, 6 and 7 and include interlocking elements for securing the flaps in their deformed positions. Each flap inner end 42 has an arm 50 extending inwardly normal to the flat surface of the end 42, the arm terminating in a laterally bent hook 52. A rib or wall 54 protrudes inwardly from each inner end 42 and extends from one arm 50 to the other, the rib 54 being shorter than the arms 50 and terminating at an inner edge 55. Another rib 56 extends inwardly from the inner side of the wall 12, parallel to the rib 54 but longer then the rib 54. The inmost edge 58 of the rib 56 contains slots 60 corresponding in position to the arms 50, for receiving the arms 50 as shown in FIGS. 8–10, when the flaps 24 are bent inwardly; the hooks 52 extending through the slots and preventing withdrawal of the arms 50 once snapped into place. To facilitate engagement of the hooked arms 50 with the rib 56, the slots are flared outwardly at their ends.

When the flaps 24 are deformed or bent inwardly the webs 40 flex into a curve, best shown in FIGS. 8 and 9, the free ends 42 which are relatively rigid remain flat and lie in spaced planes 62 transverse to the planar surface 16. The transverse planes are nearly normal to the surface 16 but it is preferred that they be a few degrees less than normal to enhance the contact wiping action when the male connector is inserted. To hold the flaps firmly in position against pressure exerted by the male connector 34, the inner edge 55 of rib 54 abuts the side of the rib 56. Thus the two ribs coact to form a stop. When the hook arms 50 are initially locked into the slots 60 the inner edge 55 is pressed against the rib 56, but there is sufficient tolerance that the inner edge may separate a slight distance from the rib 56 when assembly force is removed, as indicated in FIG. 10. This allows a small amount of flap resilience during insertion of the connector 34, but flap deflection is limited by the seating of the rib 54 on the rib 56.

In practice, it has been determined that when the case is molded of polypropylene, a typical wall thickness of about 2 mm results in a rigid case. To obtain flexibility of the web 40, a thickness of 1 mm provides good resilience and formability for a web radius of about 5 mm or 6 mm.

It will thus be seen that the method and the circuit board structure described herein results in an inexpensive instrument cluster case which is easily fabricated and avoids the use of either flexible mylar printed circuits or separate connectors on the case. The structure requires forming a planar printed circuit for simplicity and low cost, and forms a connector which is compatible with standard harness connectors.

The embodiments of the invention in which an exclusive property or privilege is claimed are defined as follows:

1. The method of manufacturing a printed circuit board with an integral wipe-in connector socket comprising the steps of:

molding of resilient material a planar substrate defining a pair of flaps having ends comprising terminal portions;

plating a surface of the substrate with conductive pathways, the pathways defining terminal strips on the flaps;

then forming a connector socket by deforming the flaps to extend the terminal portions into planes transverse to the planar substrate with the terminal strips facing one another; and securing the terminal portions of the flaps to remain in the transverse planes.

2. The invention as defined in claim 1 wherein:

the step of molding includes forming attachment details on the surface of the substrate opposite the plating; and the securing step includes coupling the attachment details.

3. The invention as defined in claim 1 wherein the flaps as produced by the molding step have adjacent ends integrally joined, and wherein:

the forming step includes breaking apart the adjacent ends of the flaps.

4. The invention as defined in claim 1 wherein the planar substrate is formed with a rigid portion surrounding the flaps, the flaps each have a rigid terminal section and a flexible section joining the rigid terminal section to the rigid portion, and wherein:

the forming step comprises bending the flexible sections of the flaps to position the rigid terminals section in the transverse planes.

5. The invention as defined in claim 1 wherein:

the molding step includes forming ribs on the substrate adjacent the flaps and forming arms terminating in hooks on the terminal potions; and the securing step includes interlocking the hooks with the ribs.

* * * * *